(12) United States Patent
Xu et al.

(10) Patent No.: US 11,881,154 B1
(45) Date of Patent: Jan. 23, 2024

(54) DRIVE SUBSTRATE AND DISPLAY PANEL

(71) Applicant: HKC CORPORATION LIMITED, Shenzhen (CN)

(72) Inventors: Zhongxie Xu, Shenzhen (CN); Haoxuan Zheng, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 17/987,777

(22) Filed: Nov. 15, 2022

(30) Foreign Application Priority Data

Jun. 29, 2022 (CN) .......................... 202210746915.1

(51) Int. Cl.
*G09G 3/32* (2016.01)
*H01L 33/62* (2010.01)
*H01L 25/075* (2006.01)

(52) U.S. Cl.
CPC ........... *G09G 3/32* (2013.01); *H01L 25/0753* (2013.01); *H01L 33/62* (2013.01); *G09G 2330/06* (2013.01)

(58) Field of Classification Search
CPC .. G09G 3/32; G09G 2330/06; H01L 25/0753; H01L 33/62
See application file for complete search history.

(56) References Cited

U.S. PATENT DOCUMENTS

| | | | | |
|---|---|---|---|---|
| 6,891,743 | B2* | 5/2005 | Ohbayashi | G11C 11/4125 |
| | | | | 257/E27.099 |
| 2016/0163738 | A1* | 6/2016 | Sato | H01L 27/1255 |
| | | | | 257/43 |
| 2018/0254226 | A1* | 9/2018 | Iguchi | H01L 27/156 |
| 2019/0036073 | A1 | 1/2019 | Yu et al. | |
| 2019/0296202 | A1 | 9/2019 | Chen et al. | |
| 2020/0203420 | A1 | 6/2020 | Wu et al. | |

FOREIGN PATENT DOCUMENTS

| | | |
|---|---|---|
| CN | 101728365 A | 6/2010 |
| CN | 102324421 A | 1/2012 |
| CN | 106601733 B | 10/2018 |
| CN | 109285460 A | 1/2019 |
| CN | 110098198 A | 8/2019 |
| CN | 110112173 A | 8/2019 |
| CN | 111352281 A | 6/2020 |
| WO | WO2022088076 A1 | 5/2022 |

OTHER PUBLICATIONS

Chinese first office action, Application No. 202210746915.1,dated Aug. 16, 2022(18 pages).
Chinese second office action, Application No. 202210746915.1,dated Sep. 5, 2022(16 pages).

* cited by examiner

*Primary Examiner* — Stephen G Sherman

(57) ABSTRACT

The present application provides a drive substrate and a display panel. The drive substrate includes: a substrate; a pixel driving circuit layer, arranged on the substrate; a first pad and a second pad spaced apart from the first pad, arranged on a side of the pixel driving circuit layer away from the substrate, and electrically connected to the pixel driving circuit layer. The drive substrate further includes an electrostatic protection line, the electrostatic protection line is spaced from the first pad, a side of the first pad facing the electrostatic protection line is arranged with a first toothed tip, and a side of the electrostatic protection line facing the first pad is arranged with a second toothed tip.

18 Claims, 6 Drawing Sheets

US 11,881,154 B1

DRIVE SUBSTRATE AND DISPLAY PANEL

CROSS REFERENCE TO RELATED APPLICATIONS

The present disclosure claims priority of Chinese Patent Application No. 202210746915.1, filed on Jun. 29, 2022 in China National Intellectual Property Administration, the entire contents of which are hereby incorporated by reference in their entireties.

TECHNICAL FIELD

The present disclosure relates to the field of displaying, and in particular to a drive substrate and a display panel.

BACKGROUND

A micro light-emitting diode (micro LED) display device may have high contrast, fast response, a wide viewing angle, a wide color gamut, high brightness, low power consumption, a long service life and high stability. As LED chips develop, technologies related to micro LED displays has become one of the most competitive image displaying technologies in the future.

Generally, since the display device requires a large number of light-emitting elements, while manufacturing the display device, light-emitting elements arranged in an array need to be transferred from an original substrate to a drive substrate. While the light-emitting elements are being transferred, transferring the large number of light-emitting elements to the drive substrate needs to be performed continuously. Therefore, inevitably, the light-emitting elements and drive substrate may be constantly moved, rubbed, adsorbed, pressed, heated, irradiated, separated, and so on, such that electrostatic charges may be generated constantly. The drive substrate and a chip substrate of the light-emitting elements may be made of insulating material. A large number of electrostatic charges may not escape in time and may accumulate on the light-emitting elements and the drive substrate. When the light-emitting elements contact a pad of the drive substrate, electrostatic breakdown may be caused, leading to damage to the drive substrate or the light-emitting elements. The damage may occur to a large area of the substrate, and the substrate may not be repaired easily.

SUMMARY OF THE DISCLOSURE

According to a first aspect of the present disclosure, a drive substrate is provided and includes:
 a substrate;
 a pixel driving circuit layer, arranged on the substrate;
 a first pad and a second pad spaced apart from the first pad, arranged on a side of the pixel driving circuit layer away from the substrate, and electrically connected to the pixel driving circuit layer.

The drive substrate further comprises an electrostatic protection line, the electrostatic protection line is spaced from the first pad, a side of the first pad facing the electrostatic protection line is arranged with a first toothed tip, and a side of the electrostatic protection line facing the first pad is arranged with a second toothed tip.

According to a second aspect, a display panel is provided and includes:
 the drive substrate according to any of the above embodiments; and
 a plurality of light-emitting elements, wherein an anode of each of the plurality of light-emitting elements is connected to the first pad, and a cathode of each of the plurality of light-emitting elements is connected to the second pad.

REFERENCE NUMERALS

Figure 1:
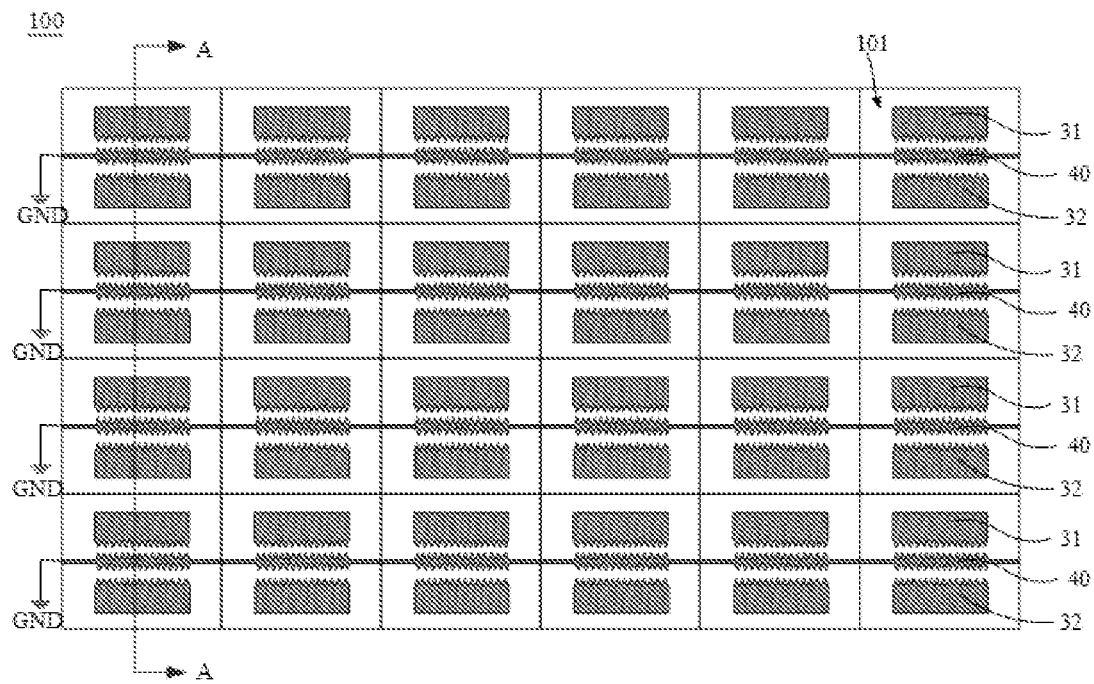
FIG. 1 is a structural schematic view of a drive substrate according to a first embodiment of the present disclosure.

100—drive substrate; 10—substrate; 20—pixel driving circuit layer; 21—circuit structural layer; 22—top insulating layer; 31—first pad; 32—second pad; 311—first toothed tip; 40—electrostatic protection line; 40a—electrostatic protection sub-line; 401—second toothed tip; 321—third toothed tip; 402—fourth toothed tip; 101—pixel region; 11—row pixel region; 41—first short circuit portion; 42—second short circuit portion; 51—first through hole; 52—second through hole; 53—third through hole; 200—light-emitting element.

DETAILED DESCRIPTION

Technical solutions of the embodiments of the present disclosure will be clearly and completely described below by referring to the accompanying drawings in the embodiments of the present disclosure. Obviously, the described embodiments show only some of, but not all of, the embodiments of the present disclosure. All other embodiments obtained by any ordinary skilled person in the art based on the embodiments in the present disclosure without making creative work shall fall within the scope of the present disclosure.

Terms "first", "second" and "third" in the present disclosure are used for descriptive purposes only, and shall not be interpreted as indicating or implying relative importance or implicitly specifying the number of the described technical features. Therefore, features defined by the "first", "second" and "third" may explicitly or implicitly include at least one such feature. In the present disclosure, "a plurality of"

means at least two, such as two, three, and so on, unless otherwise expressly and specifically limited. All directional indications (such as up, down, left, right, forward, backward . . . ) in the present disclosure are used to explain relative positions between components at a particular pose (the pose shown in the accompanying drawings), movements, and so on. When the particular pose changes, the directional indications may change accordingly. In addition, terms "includes", "has", and any variations thereof, are intended to cover non-exclusive inclusion. For example, a process, a method, a system, a product or an apparatus including a series of operations or units is not limited to the listed operations or units, but may further include operations or units that are not listed, or other operations or units that are inherent to the process, the method, the product, or the apparatus.

An "embodiment" of the present disclosure means that a particular feature, a structure, or a property described one embodiment may be included in at least one other embodiments of the present disclosure. The presence of the term at various sections in the specification does not necessarily mean a same embodiment or a separate or an alternative embodiment that is mutually exclusive with other embodiments. It shall be understood explicitly and implicitly by the ordinary skilled person in the art that the embodiments described herein may be combined with other embodiments.

The present disclosure will be described in details in the following by referring to the accompanying drawings and embodiments.

Figure 2:
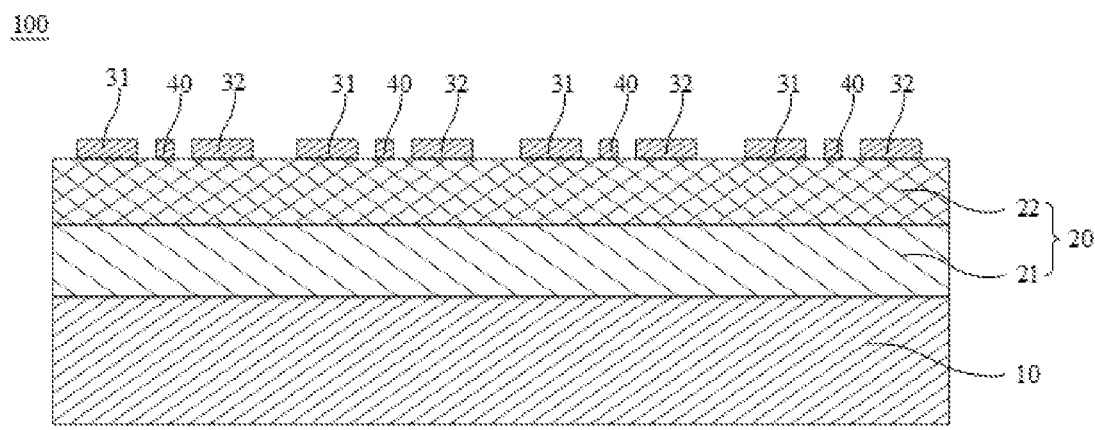
FIG. 2 is a structural schematic view of a cross section of the drive substrate taken along the line A-A shown in FIG. 1.

FIG. 1 is a structural schematic view of a drive substrate according to a first embodiment of the present disclosure, and FIG. 2 is a structural schematic view of a cross section of the drive substrate taken along the line A-A shown in FIG. 1. The present embodiment provides a drive substrate 100 that includes a substrate 10, a pixel driving circuit layer 20, a first pad 31 and a second pad 32.

The substrate 10 may be a plate. A shape and a size of the substrate 10 may be determined based on actual demands. For example, the substrate 10 of the drive substrate 100 may be determined based on a size of a display area of a display panel and a shape of the display panel. The substrate 10 may be a flexible substrate or a rigid substrate. In detail, the substrate 10 may be made of an insulating material, such as glass, resin, organic polymeric material, and so on. The substrate 10 may alternatively be metal, and an insulating layer may be arranged on the metal substrate to prevent a short circuit between the metal substrate and the pixel driving circuit layer 20. In some embodiments, the substrate 10 may include an isolation layer and a bottom insulating layer arranged on the isolation layer.

The pixel driving circuit layer 20 is arranged on the substrate 10. In detail, the pixel driving circuit layer 20 includes a circuit structure layer 21 and a top insulating layer 22 covering the circuit structure layer 21. The circuit structure layer 21 includes a plurality of pixel driving circuits arranged in an array for driving light-emitting elements 200 in pixels to emit light. The top insulating layer 22 is arranged on the a of the circuit structure layer 21 away from the substrate 10 and covers the plurality of pixel driving circuits for protecting the pixel driving circuits to prevent the pixel driving circuit from being interfered by signals or from being structurally damaged. In detail, a surface of the pixel driving circuit layer 20 has a plurality of pixel regions 101 arranged in an array. One first pad 31 and one second pad 32 are arranged in each of the plurality of pixel regions 101, and each of the plurality of pixel regions 101 corresponds to one of the plurality of pixel driving circuits.

The first pad 31 and the second pad 32 are spaced apart from each other. Each of the first pad 31 and the second pad 32 is arranged on a side of the pixel driving circuit layer 20 away from the substrate 10 and is electrically connected to the pixel circuit layer. In some embodiments, the first pad 31 and the second pad 32 are arranged on a surface of the top insulating layer 22 away from the circuit structure layer 21. In detail, the top insulating layer 22 has a plurality of through holes. Each of the first pad 31 and the second pad 32 corresponds to one of the plurality of through holes, such that each of the first pad 31 and the second pad 32 is electrically connected to a corresponding one of the plurality of pixel driving circuits through the corresponding one of the plurality of through holes. One pixel driving circuit corresponds to one first pad 31 and one second pad 32. The first pad 31 and the second pad 32, which correspond to a same pixel driving circuit, are treated as one pad group. As shown in FIG. 1, corresponding to the plurality of pixel driving circuits arranged in the array, the plurality of first pads 31 and second pads 32 (a plurality of pad groups) are also arranged in an array.

Figure 3:
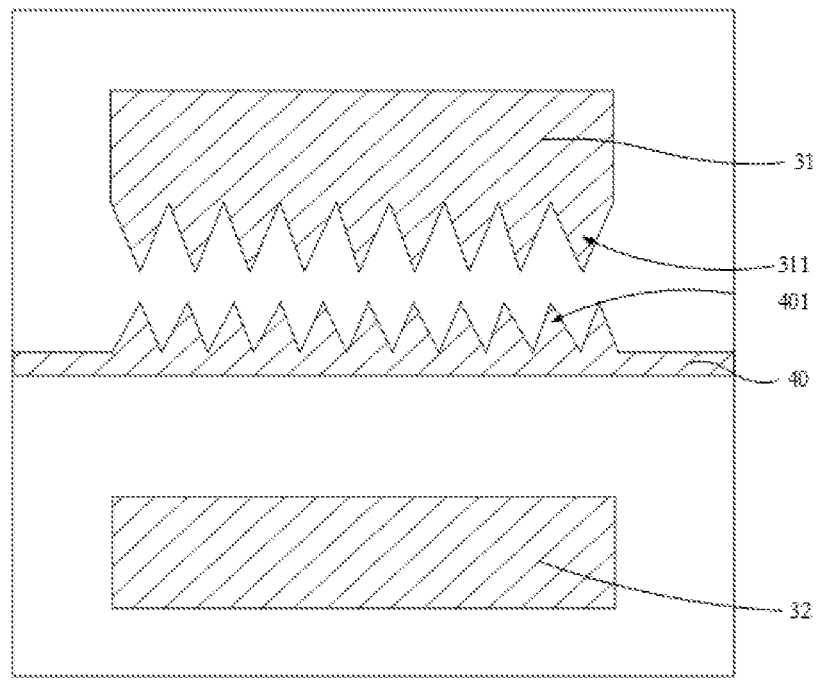
FIG. 3 is a structural schematic view of an electrostatic protection line, a first pad and a second pad according to the first embodiment of the present disclosure.

FIG. 3 is a structural schematic view of an electrostatic protection line, a first pad and a second pad according to the first embodiment of the present disclosure. In the present embodiment, the drive substrate 100 further includes an electrostatic protection line 40, which is spaced apart from the first pad 31. In detail, a side of the first pad 31 facing the electrostatic protection line 40 is arranged with a first toothed tip 311, and a side of the electrostatic protection line 40 facing the first pad 31 is arranged with a second toothed tip 401. That is, the first toothed tip 311 and the second toothed tip 401 are facing each other. In some embodiments, the first pad 31, the second pad 32, and the electrostatic protection line 40 may be formed by patterning a same conductive layer, reducing the number operations to be performed. The first pad 31, the second pad 32, and the electrostatic protection line 40 are made of a same material, such as metal or indium tin oxide (ITO).

Figure 4:
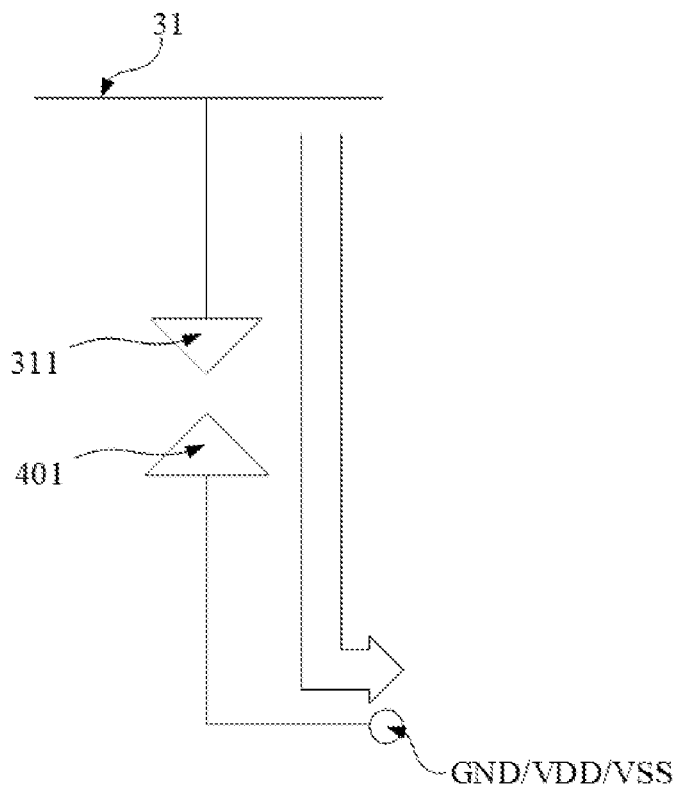
FIG. 4 shows a principle of tip-discharging between the electrostatic protection line and the first pad shown in FIG. 3.

In detail, FIG. 4 shows a principle of tip-discharging between the electrostatic protection line and the first pad shown in FIG. 3. In the present embodiment, while transferring all light-emitting elements 200 at once to the drive substrate 100, operations, such as moving, rubbing, adsorbing, pressing, heating, irradiating, separating and so on, may be performed, causing a large number of electrostatic charges to be generated on the light-emitting elements 200 and the first pad 31 of the drive substrate 100, and the large number of electrostatic charges may not escape in time. The first toothed tip 311 of the first pad 31 may allow the electrostatic charges accumulated on the drive substrate 100 to be concentrated at the first toothed tip 311. When the charges are accumulated to reach a threshold, tip discharging may occur at the first toothed tip 311. At this moment, a current path is formed between the first toothed tip 311 and the second toothed tip 401 facing the first toothed tip 311, such that the electrostatic charges may be transferred through the current path to the electrostatic protection line 40 and further be transferred to other places through the electrostatic protection line 40. For example, the electrostatic protection line 40 may be connected to a ground terminal GND or connected to other signal lines, such as a VDD signal line or a VSS signal line, such that the electrostatic current may flow from the second toothed tip 401 along the electrostatic protection line 40 to the ground terminal GND or the other signal lines. In this way, the electrostatic charges on the drive substrate 100 may be neutralized in time, and the drive substrate 100 may not be charged, preventing the electrostatic breakdown when the light-emitting element 200 being mated with the first pad 31 and the second pad 32, such that the driver substrate 100 or the light-emitting elements 200 may not be damaged. In addition, when the light-emitting element 200 is mated with the first pad 31 and the second pad 32, the electrostatic charges accumulated on the light-emitting elements 200 may be transferred to the first pad 31 of the first toothed tip 311 by contact. Further, the above-mentioned tip-discharging may occur to allow the electrostatic charges on the light-emitting elements 200 to be neutralized, and the light-emitting elements 200 may be uncharged, further preventing the electrostatic breakdown when the light-emitting element 200 being mated with the first pad 31 and the second pad 32, such that the driver substrate 100 or the light-emitting elements 200 may not be damaged. Further, the drive substrate 100 may be arranged with only the electrostatic protection line 40 which is facing the first pad, and each of the side of the first pad facing the electrostatic protection line and the side of the electrostatic protection line facing the first pad is arranged with the toothed tip. The structure of the drive substrate may be relatively simple, and the production cost may be reduced.

It shall be understood that, in order to ensure a better tip-discharging effect, an angle of a pointed corner of the first toothed tip 311 and an angle of a pointed corner of the second toothed tip 401 may be arranged as small as possible. For example, each of the angle of the pointed corner of the first toothed tip 311 and the angle of the pointed corner of the second toothed tip 401 may be less than 45°, such that the electrostatic charges at the first toothed tip 311 may be highly concentrated and may be easily discharged. In this way, the electrostatic charges may be neutralized in time, an electrostatic protection effect of the drive substrate 100 may be improved. Further, the number of pointed corners of the first toothed tip 311 and the number of pointed corners of the second toothed tip 401 may be more than one, such that the electrostatic charges may be discharged through the more than one pointed corners. That is, the electrostatic charges may be transferred to the electrostatic protection line 40 through more than one paths. A rate of transferring the electrostatic charges may be increased, further enhancing the electrostatic protection effect for the drive substrate 100.

Figure 5:
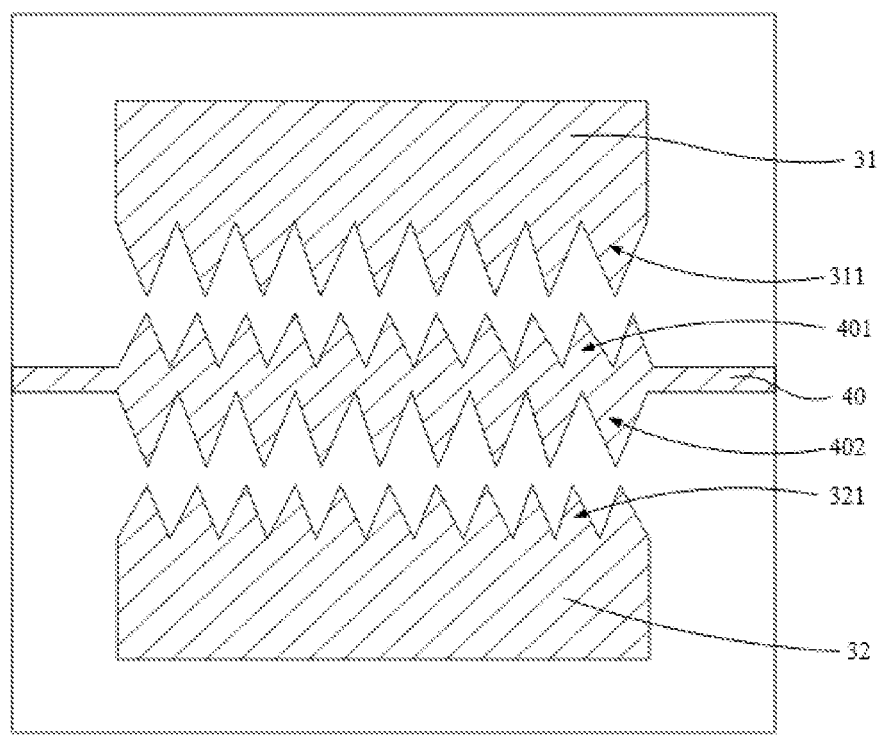
FIG. 5 is another structural schematic view of the electrostatic protection line, the first pad and the second pad according to the first embodiment of the present disclosure.

FIG. 5 is another structural schematic view of the electrostatic protection line, the first pad and the second pad according to the first embodiment of the present disclosure. In detail, the electrostatic protection line 40 is disposed between the first pad 31 and the second pad 32 and is spaced apart from the first pad 31 and the second pad 32. In detail, the side of the first pad 31 facing the electrostatic protection line 40 is arranged with the first toothed tip 311, and the side of the electrostatic protection line 40 facing the first pad 31 is arranged with the second toothed tip 401. In addition, a side of the second pad 32 facing electrostatic protection line 40 is arranged with a third toothed tip 321, and a side of the electrostatic protection line 40 facing the second pad 32 is arranged with a fourth toothed tip 402. That is, the first toothed tip 311 is facing the second toothed tip 401, and the third toothed tip 321 is facing the fourth toothed tip 402.

Therefore, for the drive substrate 100 provided in the present embodiment, the first pad 31 is arranged with the first toothed tip 311, and the side of the electrostatic protection line 40 facing the first toothed tip 311 is arranged with the second toothed tip 401. In this way, the electrostatic charges on the first pad 31 may be neutralized in time, and the first pad may not be charged. Further, when the light-emitting element 200 is mated with the first pad 31, the electrostatic charges accumulated on the light-emitting element 200 may be transferred to the first toothed tip 311 of the first pad 31 due to contact. Further, the tip-discharging may occur to neutralize the electrostatic charges on the light-emitting element 200, and the light-emitting element 200 may be uncharged. In this way, electrostatic breakdown may be prevented when the light-emitting element 200 is mated with the first pad 31, and the drive substrate 100 and the light-emitting element 200 may not be damaged.

Further, for the drive substrate 100 provided in the present embodiment, the side of the second pad 32 facing the electrostatic protection line 40 is arranged with the third toothed tip 321, and the side of the electrostatic protection line 40 facing the second pad 32 is arranged with the fourth toothed tip 402. In this way, the electrostatic charges on the second pad 32 may be concentrated at the third toothed tip 321 may be neutralized by being discharged through the tip in time, and the second pad 32 may be uncharged. Further, when the light-emitting element 200 is mated with the second pad 32, the electrostatic charges accumulated on the light-emitting element 200 may be transferred to the third toothed tip 321 of the second pad 32 due to contact, and the tip-discharging may occur to neutralize the electrostatic charges on the light-emitting element 200, such that the light-emitting element 200 may be uncharged. In this way, electrostatic breakdown may be prevented when the light-emitting element 200 is mated with the second pad 32, and the first pad 31 and the second pad 32 of the drive substrate 100 and/or the light-emitting element 200 may not be damaged, further ensuring the electrostatic protection for the drive substrate 100, improving the product yield. In addition, for the drive substrate, only the shape of the first pad 31 and the shape of the second pad 32 are modified, and the electrostatic protection line is arranged between the first pad and the second pad. The structure of the drive substrate may be relatively simple, and the production cost may be reduced.

It shall be understood that, in order to achieve a better tip-discharging effect, configuration of a pointed corner of the third toothed tip 321 and configuration of a pointed corner of the fourth toothed tip 402 may be similar or the same as those of the first toothed tip and the second toothed tip in the above embodiments. The pointed corners of the third toothed tip 321 and the fourth toothed tip 402 may be determined based on actual demands and will not be limited herein.

Further referring to FIG. 1, in the present embodiment, the surface of the pixel driving circuit layer 20 has the plurality of pixel regions 101 arranged in the array. One first pad 31 and one second pad 32 are arranged in each of the plurality of pixel regions 101. One electrostatic protection line 40 is disposed between first pads 31 and second pads 32 that are arranged in one row of pixel regions 101 or in one column of pixel regions 101. In detail, structures and functions of the first pads 31 arranged in the plurality of pixel regions 101 may be the same as or similar to the structure and the function of the first pad 31 described in the above embodiments; and structures and functions of the second pads 32 arranged in the plurality of pixel regions 101 may be the same as or similar to the structure and the function of the second pad 32 described in the above embodiments, and therefore, the structures and the functions of the pads will not be repeatedly described herein. In each of the plurality of pixel regions 101, the side of the electrostatic protection line 40 facing the first toothed tip 311 is arranged with the second toothed tip 401, and the side of the electrostatic protection line 40 facing the third toothed tip 321 is arranged with the fourth toothed tip 402. In this way, the electrostatic charges accumulated on the first pad 31 are transferred to the second toothed tip 401 through tip-discharging of the first toothed tip 311 and are further transferred to other places through the electrostatic protection line 40. The electrostatic charges accumulated on the second pad 32 are transferred to the fourth toothed tip 402 through tip-discharging of the third toothed tip 321 and are further transferred to other places through the electrostatic protection line 40. In this way, the number of electrostatic protection lines 40 to be arranged may be reduced, a space of the drive substrate 100 may be saved.

In some embodiments, in one row of pixel regions 101, the first pads 31 and the second pads 32 are arranged in two rows. Therefore, for one row of pixel regions 101, one electrostatic protection line 40 is disposed between the first pads 31 and the second pads 32. For a plurality of rows of pixel regions 101, a plurality of electrostatic protection lines 40 are arranged in a plurality of rows. In one column of pixel regions 101, the first pads 31 and the second pads 32 are arranged in two columns. Therefore, for one column of pixel regions 101, one electrostatic protection line 40 is disposed between the first pads 31 and the second pads 32. For a plurality of columns of pixel regions 101, a plurality of electrostatic protection lines 40 are arranged in a plurality of columns.

In the present embodiment, in order to arrange one electrostatic protection line 40 between the first pads 31 and the second pads 32 that are arranged in one row or in one column of pixel regions 101, electrostatic protection lines 40 in all pixel regions 101 of one row or one column are connected with each other in series. Therefore, the number of electrostatic protection lines 40 arranged on the drive substrate 100 may be effectively reduced, saving spaces for arranging other elements or components in the pixel regions 101.

Figure 6:
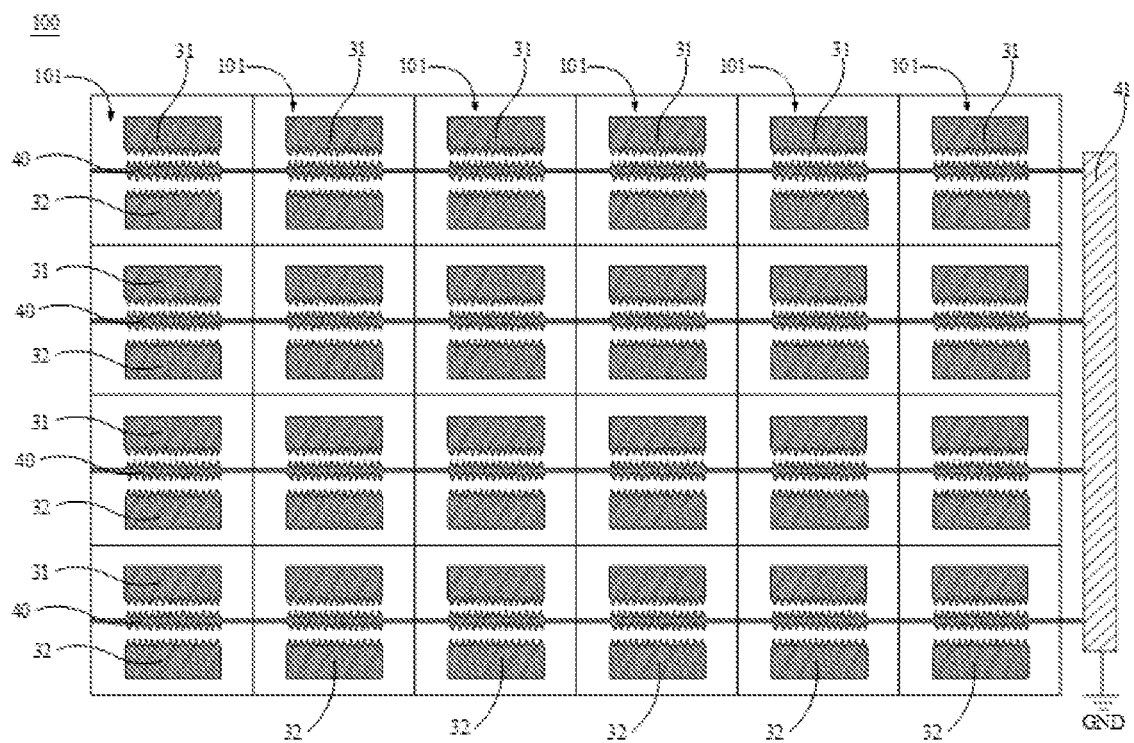
FIG. 6 is a structural schematic view of a drive substrate according to a second embodiment of the present disclosure.

FIG. 6 is a structural schematic view of a drive substrate according to a second embodiment of the present disclosure. In the present embodiment, ends of the plurality of electrostatic protection lines 40 arranged in the plurality of rows of pixel regions 101 or in the plurality of columns of pixel regions 101 may be connected by a short circuit. In this way, current signals of electrostatic discharging through the plurality of electrostatic protection lines 40 may be discharged to other places through the short circuit. Compared to the first embodiment which shows the plurality of electrostatic protection lines 40 being individually grounded or connected to signal lines of the pixel driving circuit layer 20, in the preset embodiment, the ends of the plurality of protection lines are connected to a first short circuit 41. Therefore, the plurality of electrostatic protection lines 40 may all be connected to the signal line of the pixel driving circuit layer 20 or the ground through the first short circuit 41, further reducing the number of lines on the drive substrate 100 and reducing a size of the drive substrate 100. The first short circuit 41 may be arranged in the display area or in the non-display area. In the present embodiment, the first short circuit 41 may be arranged in the non-display area.

In the present embodiment, the electrostatic protection lines 40 are grounded or are electrically connected to the signal lines of the pixel driving circuit layer 20. The ends of the plurality of electrostatic protection lines 40 are shorted through the first short circuit 41. The first short circuit 41 is grounded, such that the plurality of electrostatic protection lines 40 are grounded through the first short circuit 41. In this way, the electrostatic charges may be discharged through the tips to a grounded terminal. In detail, when an electrostatic discharging current signal is positive, the current is transferred from the first toothed tip 311 to the electrostatic protection lines 40, and further transferred to the grounded terminal through the electrostatic protection lines 40, such that the electrostatic charges are neutralized. When the electrostatic discharging current signal is negative, the current is transferred from the grounded terminal to the second toothed tip 401 and/or the fourth toothed tip 402 and further transferred to the first toothed tip 311 and/or the third toothed tip 321, such that the electrostatic charges are neutralized.

Figure 7:
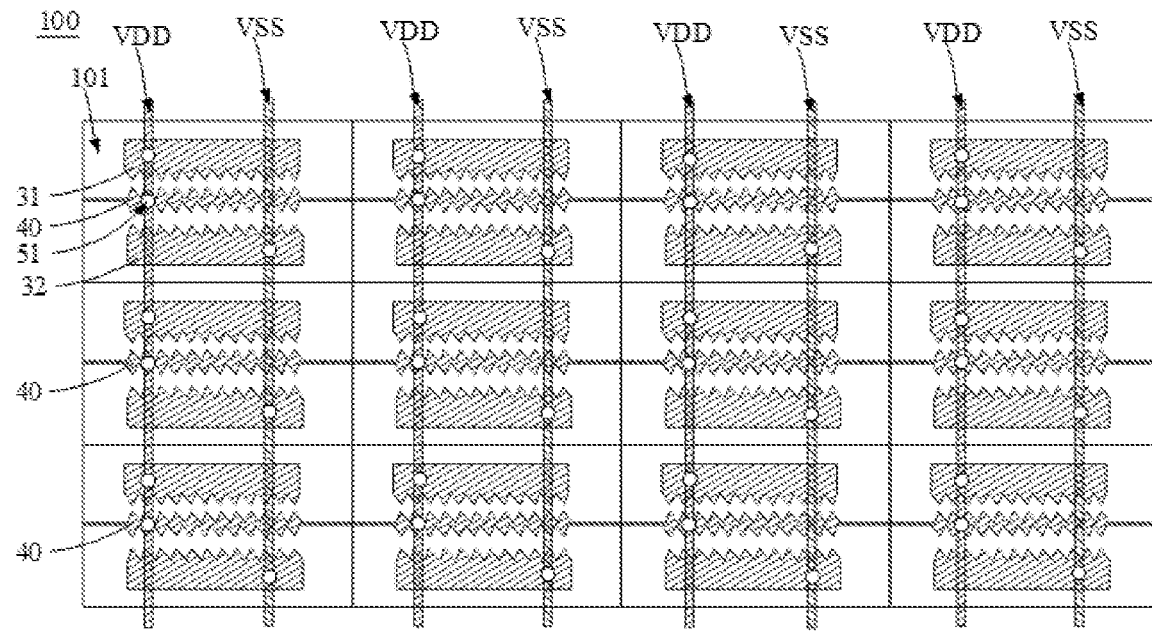
FIG. 7 is a structural schematic view of a drive substrate according to a third embodiment of the present disclosure.

FIG. 7 is a structural schematic view of a drive substrate according to a third embodiment of the present disclosure. In the present embodiment, the pixel driving circuit layer 20 includes a plurality of VDD signal lines and a plurality of VSS signal lines. The first pads 31 are electrically connected to the VDD signal lines, and the second pads 32 are electrically connected to the VSS signal lines. The electrostatic protection lines 40 are electrically connected to the VDD signal lines. Each of the plurality of VDD signal lines is an operating voltage signal line of the pixel driving circuit, and each of the plurality of VSS signal lines is a negative signal line of a power supply or a signal line of a common grounded terminal. In detail, a first through hole 51 is defined in the top insulating layer 22 between the conductive layer, which is arranged with the electrostatic protection lines 40, and the circuit structure layer 21 and defined at a location where the electrostatic protection line 40 intersects with the VDD signal line. The electrostatic protection line 40 is electrically connected to the VDD signal line through the first through hole 51, and the electrostatic charges are released to the VDD signal line through tip-discharging, preventing the driver substrate 100 and the light-emitting elements 200 from being electrostatically broken and being damaged. In detail, structures and functions of the first pad 31, second pad 32 and the electrostatic protection line 40 may be the same as or similar to those described in the above embodiments, and will not be repeatedly described.

It shall be understood that, in the present embodiment, for pixel regions 101 of one row or one column corresponding to one electrostatic protection line 40, the first through-hole 51 is defined in each of the pixel regions 101 in the row or in the column. The electrostatic protection line 40 in each of the pixel regions 101 in one row or one column is electrically connected to a corresponding VDD signal line. Therefore, the electrostatic charges may be discharged quickly. Alternatively, for pixel regions 101 of one row or one column corresponding to one electrostatic protection line 40, the first through hole 51 is defined in every few pixel regions 101 in one row or in one column, and the electrostatic protection line 40 for the pixel regions 101 in one row or one column is electrically connected to a corresponding VDD signal line through the first through holes 51. Therefore, the number of first through holes 51 may be reduced, and the structure of the substrate may be simplified. Further, for pixel regions 101 of one row or one column corresponding to one electrostatic protection line 40, only one first through hole 51 may be defined, such that the number of through hole may be reduced optimally, simplifying the structure of the substrate.

Figure 8:
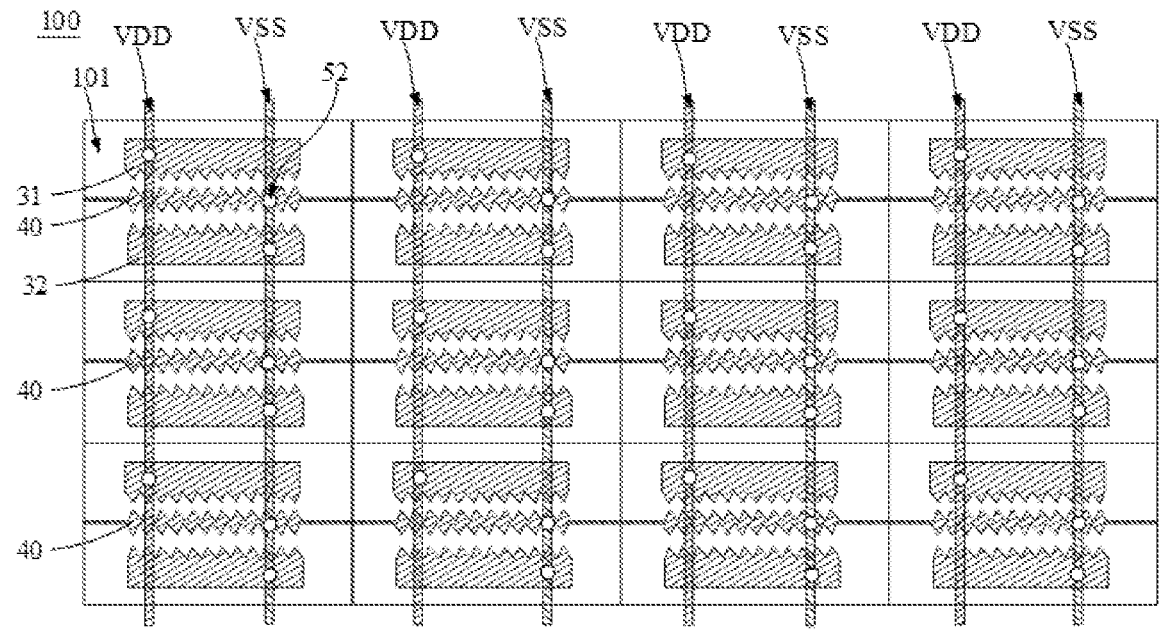
FIG. 8 is a structural schematic view of a drive substrate according to a fourth embodiment of the present disclosure.

FIG. 8 is a structural schematic view of a drive substrate according to a fourth embodiment of the present disclosure. In the present embodiment, the electrostatic protection line 40 may be electrically connected to the VSS signal line. In detail, a second through hole 52 is defined in the top insulating layer 22 between the conductive layer, which is arranged with the electrostatic protection line 40, and the circuit structure layer 21 and defined at a location where the electrostatic protection line 40 intersects with the VSS signal line. The electrostatic protection line 40 is electrically connected to the VSS signal line through the second through hole 52. In this way, the electrostatic charges may be discharged to the VSS signal line through tip-discharging, protecting the drive substrate 100 and the light-emitting element 200 from being damaged by electrostatic breakdown. In detail, structures and functions of the first pad 31, the second pad 32 and the electrostatic protection line 40 may be the same as or similar to those described in the above embodiments and will not be repeated here. The second through hole 52 may be defined in a same or similar manner as the first through hole 51, which will not be repeated herein.

Figure 9:
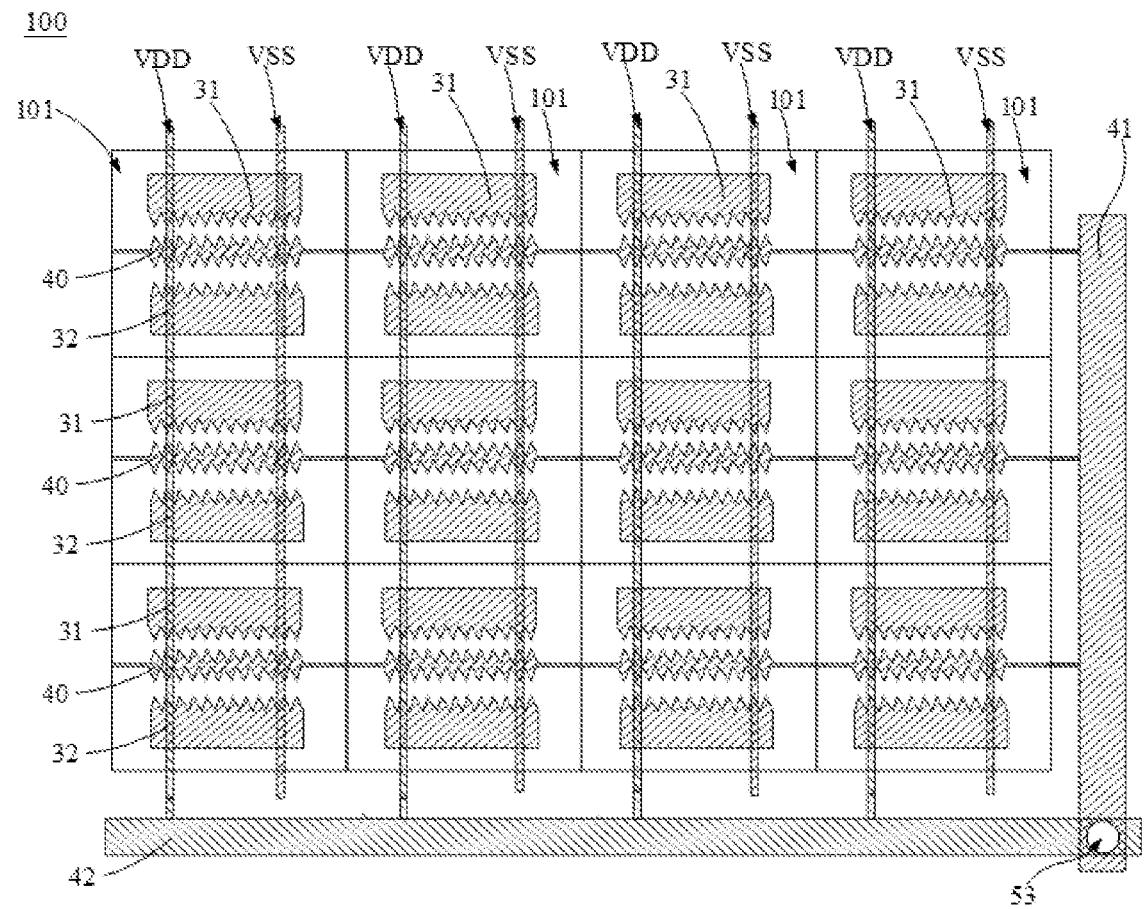
FIG. 9 is a structural schematic view of a drive substrate according to a fifth embodiment of the present disclosure.

FIG. 9 is a structural schematic view of a drive substrate according to a fifth embodiment of the present disclosure. In the present embodiment, ends of the plurality of electrostatic protection lines 40 are connected by the first short circuit 41, and ends of the plurality of VDD signal lines are connected by a second short circuit 42. The first short circuit 41 is electrically connected to the second short circuit 42. In detail, a third through hole 53 is defined in the top insulating layer 22 between the conductive layer, which is arranged with the electrostatic protection line 40, and the circuit structure layer 21 and defined at a location where the first short circuit 41 intersects with the second short circuit 42. The electrostatic protection line 40 is electrically connected to the VDD signal line through the third through hole 53. In this way, the electrostatic charges are discharged to the VDD signal line through tip-discharging, protecting the drive substrate 100 and the light-emitting element 200 from being damaged due to electrostatic breakdown. In the present embodiment, only one third through hole 53 may be defined to release the electrostatic charges to the VDD signal line, effectively reducing the number of through holes and saving spaces for arranging other components.

Similar to the present embodiment, in another embodiment, the ends of the plurality of electrostatic protection lines 40 are connected by the first short circuit 41, and ends of the plurality of VSS signal lines are connected by a third short circuit. The first short circuit 41 is electrically connected to the third short circuit. In detail, a fourth through hole is defined in the top insulating layer 22 between the conductive layer, which is arranged with the electrostatic protection line 40, and the circuit structure layer 21 and defined at a location where the first short circuit 41 intersects with the third short circuit. The electrostatic protection line 40 is electrically connected to the VSS signal line through the fourth through hole. In this way, the electrostatic charges are discharged to the VSS signal line through tip-discharging, protecting the drive substrate 100 and the light-emitting element 200 from being damaged due to electrostatic breakdown. In the present embodiment, only one fourth through hole is defined, and the electrostatic charges may be discharged to the VSS signal line through the fourth through hole, effectively reducing the number of through holes and saving spaces for arranging other components.

To be noted that, in some embodiments, the ends of the electrostatic protection lines are connected to other signal lines, such as a scan line, a data line, and so on. In order to prevent signals of the driver board 100 from being abnormal, which is caused by a plurality of scan lines or data lines being shorted when the electrostatic protection lines being connected to the scan lines or the data lines, one scan line cannot be connected to the plurality of scan lines or data lines at the same time. However, in the present embodiment, voltage signals transmitted through the plurality of VDD signal lines on the drive substrate 100 are the same, and voltage signals transmitted through the plurality of VSS signal lines are the same. Therefore, one electrostatic protection line may be electrically connected to the plurality of VDD signal lines or the plurality of VSS signal lines at the same time. A connection manner may be less restricted and simpler. Therefore, it may be preferred that the electrostatic protection line is connected to the VDD signal line or the VSS signal line.

Figure 10:
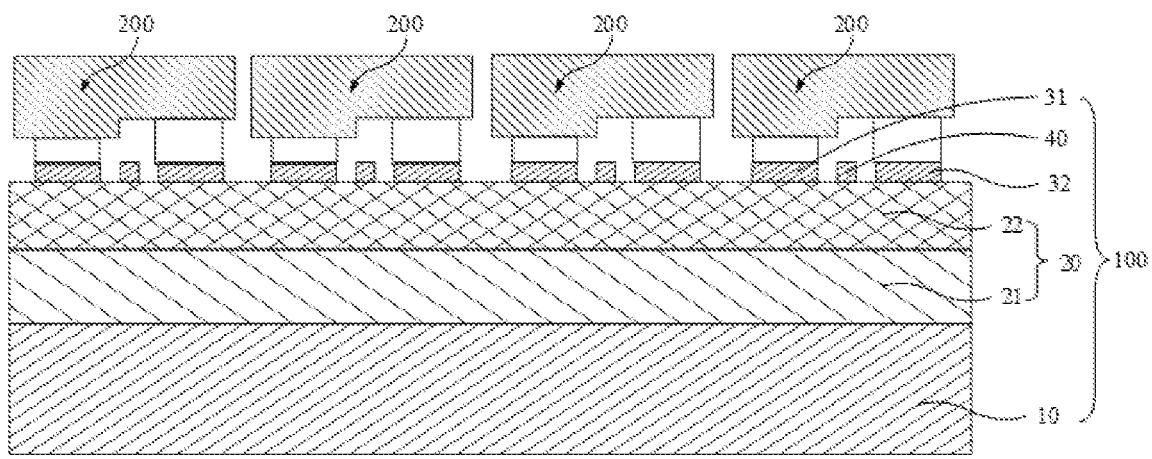
FIG. 10 is a structural schematic view of a display panel according to an embodiment of the present disclosure.

FIG. 10 is a structural schematic view of a display panel according to an embodiment of the present disclosure. The present embodiment provides a display panel. The display panel includes the drive substrate 100 and the plurality of light-emitting elements 200. The drive substrate 100 may be the drive substrate 100 of any of the above embodiments. The first pad 31 of the drive substrate 100 is electrically connected to the VDD signal line of the drive circuit layer. The second pad 32 is electrically connected to the VSS signal line of the drive circuit layer. The plurality of light-emitting elements 200 are arranged on the drive substrate 100. An anode of each of the plurality of light-emitting elements 200 is connected to the first pad 31 of the drive substrate 100, and a cathode of each of the plurality of light-emitting elements 200 is connected to the second pad 32, enabling the drive substrate 100 to drive the light-emitting elements 200 to emit light.

In detail, the light-emitting element 200 may be an LED or a current-driven light-emitting element, a micro LED, a mini LED, and so on. A size of the mini LED may be in a range of 50 micrometers to 200 micrometers, and a size of the micro LED may be less than 50 micrometers. In the present embodiment, micro LEDs may be arranged as the light-emitting elements 200 to obtain a micro LED display panel.

It shall be understood that, in some embodiments, the display panel further includes an encapsulation layer or a cover. The encapsulation layer or the cover is arranged on the light-emitting element 200 to protect the light-emitting element 200 and the drive substrate 100, preventing damages to the light-emitting element 200 and the drive substrate 100 caused by external factors.

According to the display panel provided in the present embodiment, the electrostatic protection line 40 is disposed between the first pad 31 and the second pad 32. The first pad 31, the second pad 32 and the electrostatic protection line 40 are the ones described in the above embodiments. In this way, when the plurality of light-emitting elements 200 are transferred to the drive substrate 100, electrostatic breakdown may be prevented when the light-emitting elements 200 are mated with the first pads 31 and the second pads 32, and the light-emitting elements 200 may not be damaged, improving the product yield. The structure of the display panel may be simple, costs for manufacturing the display panel may be saved, and the display panel may be easily manufactured.

Figure 11:
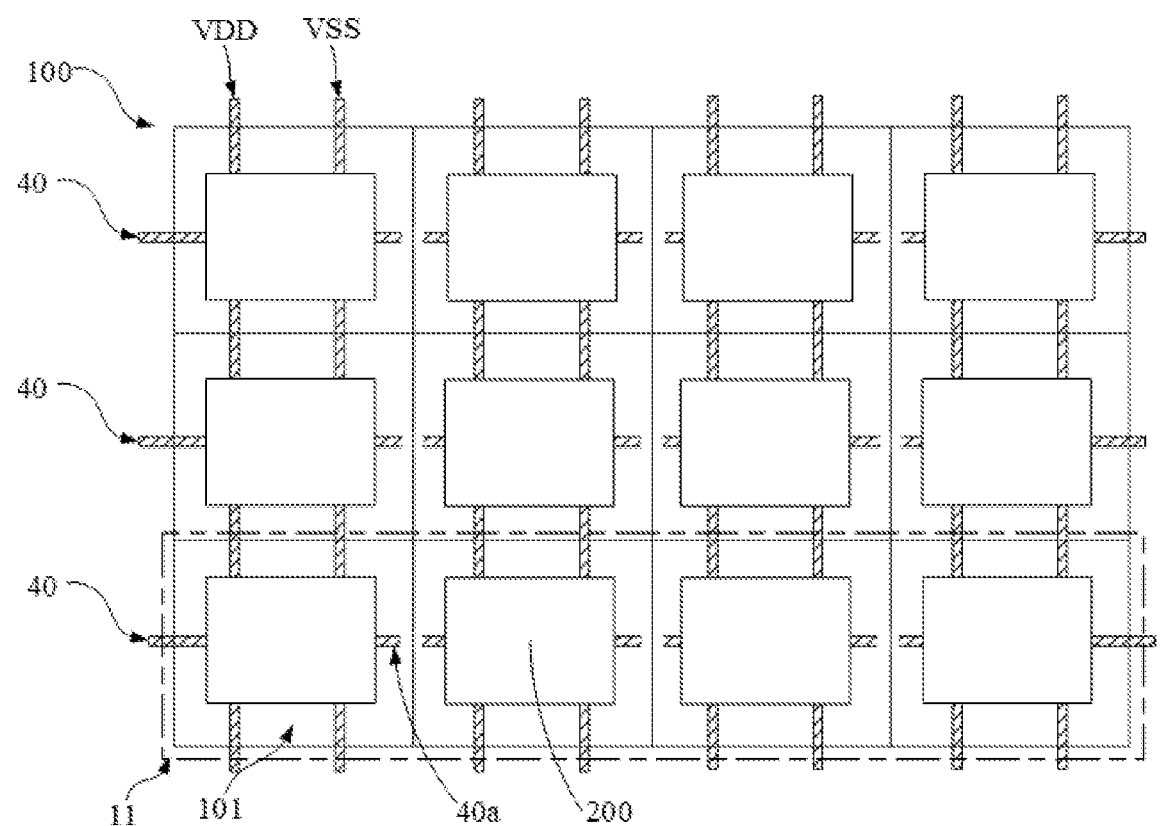
FIG. 11 is a structural schematic view of a display panel according to another embodiment of the present disclosure.

FIG. 11 is a structural schematic view of a display panel according to another embodiment of the present disclosure. It shall be understood that the electrostatic protection lines 40 are arranged on the drive substrate 100, electrical connection between the electrostatic protection lines 40 and the signal lines (such as the VDD signal lines, the VSS signal lines, VData signal lines, VGate signal lines, and so on) may lead to abnormalities of the pixel driving circuit, causing the display panel to be able to display properly due to signal abnormalities. Therefore, after the light-emitting elements 200 are transferred to the drive substrate 100, one electrostatic protection line 40, which is disposed between the first pads 31 and the second pads 32 that are arranged in one row of pixel regions 101 of the drive substrate 100, may be interrupted between adjacent columns of pixel regions 101. Alternatively, one electrostatic protection line 40, which is disposed between the first pads 31 and the second pads 32 that are arranged in one column of pixel regions 101 of the drive substrate 100, may be interrupted between adjacent rows of pixel regions 101.

For example, one row of pixel regions 101 include more than one pixel regions 101, and the one electrostatic protection line 40, which is arranged across the entire row of pixel regions 101, include more than one electrostatic protection line segments. Similarly, one column of pixel regions 101 include more than one pixel regions 101, and the one electrostatic protection line 40, which is arranged across the entire column of pixel regions 101, include more than one electrostatic protection line segments. Each electrostatic protection line segment is arranged in one pixel region, and the electrostatic protection line segment in one pixel region is disconnected with another electrostatic protection line segment in another pixel region adjacent to the one pixel region, i.e., two adjacent electrostatic protection line segments are disconnected with each other. The disconnection between the two adjacent electrostatic protection line segments may be present at a position between two adjacent pixel regions.

In an embodiment, as shown in FIG. 11, one row of pixel regions 101 may be defined as a row-pixel region 11, which may be applicable in any of the embodiments of the present disclosure. In the row-pixel region 11, one electrostatic protection line 40 is disposed between the first pads 31 and the second pads 32. The electrostatic protection line 40 is interrupted between adjacent pixel regions 101. That is, the electrostatic protection line 40 is interrupted within the row-pixel region 11 and is shown as a plurality of electrostatic sub-lines 40a, such that electrostatic sub-lines 40a in adjacent pixel regions 101 in the row-pixel region 11 are insulated from each other. In this way, various signal lines being shorted through the electrostatic protection line 40, which is caused by electrical connection between the electrostatic protection line 40 and the signal lines (such as the VDD signal line, the VSS signal line, the VData signal line, the VGate signal line, and so on), may be prevented, preventing the display panel from being unable to display properly due to signal abnormalities when being in use.

It shall be understood that when one electrostatic protection line 40 is arranged in one column of pixel regions 101 of the drive substrate 100, which may be similar to the above-mentioned embodiment of arranging one electrostatic protection line in one row of pixel regions 101, one column of pixel regions 101 may be defined as a column-pixel region. In the column-pixel region, the electrostatic protection line 40 is interrupted between adjacent pixel regions 101. In this way, various signal lines being shorted through the electrostatic protection line 40, which is caused by electrical connection between the electrostatic protection line 40 and the signal lines (such as the VDD signal line, the VSS signal line, the VData signal line, the VGate signal line, and so on), may be prevented, preventing the display panel from being unable to display properly due to signal abnormalities when being in use.

To be noted that, in order to allow the display panel to display full colors, in the present embodiment, every three pixel regions 101 may serve as one pixel. Light-emitting elements 200 connected correspondingly in the three pixel regions 101 may emit red light, green light and blue light, respectively, allowing the display panel to display full colors.

In some embodiments, in order to allow the display panel to display full colors, three pairs of pads may be arranged in each pixel region 101 of the drive substrate 100. Each of the three pairs of pads includes one first pad 31 and one second pad 32. The first pad 31 of each pair of pads is aligned and connected to an anode of one light-emitting element 200, and the second pad 32 of each pair of pads is aligned and connected to a cathode of one light-emitting element 200. That is, in each pixel region 101, three light-emitting elements 200 are aligned and connected, and the three light-emitting elements 200 correspond to the red light, the green light and the blue light, allowing the display panel to display full colors.

In some embodiments, the method of manufacturing the display panel may include following operations.

In an operation S10, the display panel is provided. The drive substrate 100 is the drive substrate 100 described in any of the above embodiments.

In an operation S20, the light-emitting elements 200 are transferred to the drive substrate 100, such that the anode of each of the light-emitting elements 200 is aligned and connected to the first pad 31, and the cathode of each of the light-emitting elements 200 is aligned and connected to the second pad 32.

The drive substrate 100 is arranged with the electrostatic protection line 40 between the first pad 31 and the second pad 32. The side of the first pad 31 facing the electrostatic protection line 40 is arranged with the first toothed tip 311, and the side of the second pad 32 facing the electrostatic protection line 40 is arranged with the third toothed tip 321. The side of the electrostatic protection line 40 facing the first toothed tip 311 is arranged with the second toothed tip 401, and the side of the electrostatic protection line 40 facing the third toothed tip 321 is arranged with the fourth toothed tip 402. Therefore, while performing the operation S20, the electrostatic charges generated on the drive substrate 100 may escape in time, preventing the electrostatic breakdown caused by the anode and the cathode of the light-emitting element 200 being connected to the first pad 31 and the second pad 32, and preventing the first pad 31, the second pad 32, and/or the light-emitting element 200 from being damaged, improving the product yield.

In detail, detailed operations of transferring the light-emitting elements 200 to the drive substrate 100 may be available in the related art, which will not be described in detail in the present disclosure.

The above description shows only embodiments of the present disclosure and does no limit the scope of the present disclosure. Any equivalent structure or equivalent process transformation performed based on the specification and accompanying drawings, applied directly or indirectly in other related fields, shall be equally covered by the present disclosure.

What is claimed is:

1. A drive substrate, configured to be electrically connected to at least one light-emitting element, the drive substrate comprising:
 a substrate;
 a pixel driving circuit layer, arranged on the substrate;
 a first pad and a second pad spaced apart from the first pad, arranged on a side of the pixel driving circuit layer away from the substrate, and electrically connected to the pixel driving circuit layer, wherein the first pad and the second pad are configured to be electrically connected to one of the at least one light-emitting element;

wherein the drive substrate further comprises an electrostatic protection line, the electrostatic protection line is disposed between the first pad and the second pad, the electrostatic protection line is spaced apart from the first pad and the second pad, a side of the first pad facing the electrostatic protection line is arranged with a first toothed tip, and a side of the electrostatic protection line facing the first pad is arranged with a second toothed tip.

2. The drive substrate according to claim 1, wherein a side of the second pad facing the electrostatic protection line is arranged with a third toothed tip, and a side of the electrostatic protection line facing the second pad is arranged with a fourth toothed tip.

3. The drive substrate according to claim 2, wherein the third toothed tip and the fourth toothed tip are arranged on two opposite sides of the one line.

4. The drive substrate according to claim 3, wherein,
a surface of the pixel driving circuit layer has a plurality of pixel regions arranged into an array;
one first pad and one second pad are arranged in each of the plurality of pixel regions, such that a plurality of first pads and a plurality of second pads are arranged in the plurality of pixel regions; and
for one row or one column of pixel regions of the plurality of pixel regions, one electrostatic protection line is disposed between the plurality of first pads and the plurality of second pads.

5. The drive substrate according to claim 4, wherein the array of the plurality of pixel regions comprises a plurality of rows of pixel regions and a plurality of columns of pixel regions; the electrostatic protection line is arranged across one row of the plurality of rows of pixel regions or across one column of the plurality of columns of pixel regions, such that a plurality of electrostatic protection lines are arranged in the plurality of rows of pixel regions or in the plurality of columns of pixel regions, and ends of the plurality of electrostatic protection lines are connected with each other through a first short circuit.

6. The drive substrate according to claim 5, wherein,
the pixel driving circuit layer comprises a plurality of VDD signal lines and a plurality of VSS signal lines;
the first pad comprises a plurality of first pads, and the plurality of first pads are electrically connected to the plurality of VDD signal lines, and the second pad comprises a plurality of second pads, and the plurality of second pads are electrically connected to the plurality of VSS signal lines;
the plurality of electrostatic protection lines are electrically connected to the plurality of VDD signal lines and/or the plurality of VSS signal lines;
ends of the plurality of VDD signal lines are connected with each other through a second short circuit, and ends of the plurality of VSS signal lines are connected with each other through a third short circuit; and the first short circuit is electrically connected to the second short circuit and/or the third short circuit.

7. The drive substrate according to claim 1, wherein the electrostatic protection line is grounded or electrically connected to a signal line of the pixel driving circuit layer.

8. The drive substrate according to claim 7, wherein the pixel driving circuit layer comprises a plurality of VDD signal lines and a plurality of VSS signal lines;
the first pad comprises a plurality of first pads, and the plurality of first pads are electrically connected to the plurality of VDD signal lines, and the second pad comprises a plurality of second pads, and the plurality of second pads are electrically connected to the plurality of VSS signal lines;
the electrostatic protection line comprises a plurality of electrostatic protection lines, and the plurality of electrostatic protection lines are electrically connected to the plurality of VDD signal lines and/or the plurality of VSS signal lines.

9. The drive substrate according to claim 1, wherein the pixel driving circuit layer comprises a plurality of VDD signal lines and a plurality of VSS signal lines;
the pixel driving circuit layer comprises an insulating layer and a circuit structure layer, the first pad and the second pad are arranged on a side of the insulating layer away from the circuit structure layer;
a first through hole is defined in the insulating layer and at a location where the electrostatic protection line intersects with the any one of the plurality of VDD signal lines, the electrostatic protection line is connected to the plurality of VDD signal lines through the first through hole;
a second through hole is defined in the insulating layer and at a location where the electrostatic protection line intersects with the any one of the plurality of VSS signal lines, the electrostatic protection line is connected to the plurality of VSS signal lines through the second through hole.

10. A display panel, comprising:
a drive substrate; and
a plurality of light-emitting elements, electrically connected to the drive substrate;
wherein the drive substrate comprises:
a substrate;
a pixel driving circuit layer, arranged on the substrate;
a plurality of first pads and a plurality of second pads spaced apart from the first pad, arranged on a side of the pixel driving circuit layer away from the substrate, and electrically connected to the pixel driving circuit layer, wherein one of the plurality of first pads and one of the plurality of second pads are electrically connected to one of the plurality of light-emitting elements;
wherein the drive substrate further comprises an electrostatic protection line;
for one of the plurality of first pads and one of the plurality of second pads that correspond to a same one of the plurality of light-emitting elements the electrostatic protection line is disposed between the one first pad and the one second pad, the electrostatic protection line is spaced from the one first pad and the one second pad, a side of the first pad facing the electrostatic protection line is arranged with a first toothed tip, and a side of the electrostatic protection line facing the first pad is arranged with a second toothed tip; and
an anode of each of the plurality of light-emitting elements is connected to one of the plurality of first pads, and a cathode of each of the plurality of light-emitting elements is connected to one of the plurality of second pads.

11. The display panel according to claim 10, wherein, for each of the plurality of second pads, a side of the second pad facing the electrostatic protection line is arranged with a third toothed tip, and a side of the electrostatic protection line facing the second pad is arranged with a fourth toothed tip.

12. The display panel according to claim 11, wherein the third toothed tip and the fourth toothed tip are arranged on two opposite sides of the one line.

13. The display panel according to claim 12, wherein a surface of the pixel driving circuit layer has a plurality of pixel regions arranged into an array;
- one of the plurality of first pads and one of the plurality of second pads are arranged in each of the plurality of pixel regions, such that the plurality of first pads and the plurality of second pads are arranged in the plurality of pixel regions; and
- for one row or one column of pixel regions of the plurality of pixel regions, one electrostatic protection line is disposed between the plurality of first pads and the plurality of second pads.

14. The display panel according to claim 13, wherein the array of the plurality of pixel regions comprises a plurality of rows of pixel regions and a plurality of columns of pixel regions; the electrostatic protection line is arranged across one row of the plurality of rows of pixel regions or across one column of the plurality of columns of pixel regions, such that a plurality of electrostatic protection lines are arranged in the plurality of rows of pixel regions or in the plurality of columns of pixel regions, and ends of the plurality of electrostatic protection lines are connected with each other through a first short circuit.

15. The display panel according to claim 14, wherein,
- the pixel driving circuit layer comprises a plurality of VDD signal lines and a plurality of VSS signal lines;
- the plurality of first pads are electrically connected to the plurality of VDD signal lines, the plurality of second pads are electrically connected to the plurality of VSS signal lines;
- the plurality of electrostatic protection lines are electrically connected to the plurality of VDD signal lines and/or the plurality of VSS signal lines; ends of the plurality of VDD signal lines are connected with each other through a second short circuit, and ends of the plurality of VSS signal lines are connected with each other through a third short circuit; and the first short circuit is electrically connected to the second short circuit and/or the third short circuit.

16. The display panel according to claim 13, wherein
- for one row of pixel regions of the plurality of pixel regions, the one electrostatic protection line, which is disposed between the first pads and the second pads, is interrupted at a location between two adjacent columns of pixel regions of the one row; or
- for one column of pixel regions of the plurality of pixel regions, the one electrostatic protection line, which is disposed between the first pads and the second pads, is interrupted at a location between two adjacent rows of pixel regions of the one column.

17. The display panel according to claim 10, wherein the electrostatic protection line is grounded or electrically connected to a signal line of the pixel driving circuit layer.

18. The display panel according to claim 17, wherein the pixel driving circuit layer comprises a plurality of VDD signal lines and a plurality of VSS signal lines;
- the plurality of first pads are electrically connected to the plurality of VDD signal lines, and the plurality of second pads are electrically connected to the plurality of VSS signal lines;
- the electrostatic protection line comprises a plurality of electrostatic protection lines, and the plurality of electrostatic protection lines are electrically connected to the plurality of VDD signal lines and/or the plurality of VSS signal lines.

* * * * *